(12) United States Patent
Minch

(10) Patent No.: US 6,600,363 B2
(45) Date of Patent: Jul. 29, 2003

(54) FOLDED FLOATING-GATE DIFFERENTIAL PAIR AMPLIFIER

(75) Inventor: Bradley A. Minch, Ithaca, NY (US)

(73) Assignee: Cornell Research Foundation, Inc., Ithaca, NY (US)

(*) Notice: Subject to any disclaimer, the term of this patent is extended or adjusted under 35 U.S.C. 154(b) by 0 days.

(21) Appl. No.: 10/116,848

(22) Filed: Apr. 5, 2002

(65) Prior Publication Data

US 2002/0145467 A1 Oct. 10, 2002

Related U.S. Application Data

(60) Provisional application No. 60/281,641, filed on Apr. 5, 2001.

(51) Int. Cl.[7] .............................. G06G 7/12; H03K 5/22
(52) U.S. Cl. ............................ 327/563; 327/54; 327/67
(58) Field of Search ................................. 327/560–563, 327/52, 53, 54, 56, 65, 66, 67, 77, 89; 365/185.01, 185.21, 207; 330/253

(56) References Cited

U.S. PATENT DOCUMENTS

| | | | | |
|---|---|---|---|---|
| 4,472,648 A | | 9/1984 | Prentice | 307/571 |
| 4,783,602 A | | 11/1988 | Viswanathan | 307/353 |
| 5,021,693 A | * | 6/1991 | Shima | 327/357 |
| 5,457,771 A | * | 10/1995 | Imondi et al. | 365/185.03 |
| 5,475,339 A | | 12/1995 | Maida | 327/561 |
| 5,557,234 A | * | 9/1996 | Collins | 327/563 |
| 5,656,969 A | | 8/1997 | Pulvirenti et al. | 327/561 |
| 5,818,295 A | | 10/1998 | Chimura et al. | 327/561 |
| 5,907,259 A | | 5/1999 | Yamada et al. | 327/563 |
| 5,942,936 A | * | 8/1999 | Ricco et al. | 327/563 |
| 6,014,685 A | * | 1/2000 | Marshall et al. | 708/801 |
| 6,115,293 A | * | 9/2000 | Yamashita | 365/185.21 |
| 6,434,051 B1 | * | 8/2002 | Endo | 365/185.21 |
| 6,466,482 B2 | * | 10/2002 | Shukuri et al. | 365/185.24 |

OTHER PUBLICATIONS

Ramfrez–Angulo, J., et al. ,"Low–Voltage Circuits Building Blocks Using Multiple–Input Floating–Gate Transistors", *IEEE Transactions on Circuits and Systems*, 42(11), (1995), pp. 971–974.

Yang, K., et al. ,"A Multiple Input Differential Amplifier Based on Charge Sharing on a Floating–Gate MOSFET", *Analog Integrated Circuits and Signal Processing*, 6, (1994),pp. 197–208.

Yu. C., et al. ,"Very Low Voltage Operational Amplifiers Using Floating Gate MOS Transistor", *Processing of the ISCAS*, (1993),pp. 1152–1155.

* cited by examiner

Primary Examiner—Toan Tran
(74) Attorney, Agent, or Firm—Schwegman, Lundberg, Woessner & Kluth, P.A.

(57) ABSTRACT

A floating-gate MOS differential pair amplifier has a regulating feedback voltage whose swing is folded up into the same range over which the input and output voltages swing. In one embodiment, output currents are mirror copies of differential pair currents whose sum is regulated. In a further embodiment, feedback that regulates the sum of the currents is provided to an extra control gate connected to the floating gates. The control gate comprises a capacitive voltage divider in one embodiment that is coupled to gates in the differential pair and in the current mirror.

24 Claims, 4 Drawing Sheets

FOLDED FLOATING-GATE DIFFERENTIAL PAIR AMPLIFIER

RELATED APPLICATIONS

This application claims priority to U.S. Provisional Application Serial No. 60/281,641, filed on Apr. 5, 2001, the specification of which is herein incorporated by reference.

GOVERNMENT FUNDING

The invention described herein was made with U.S. Government support under Grant Number 1R01DC03926-01 awarded by NINCD. The United States Government has certain rights in the invention.

FIELD OF THE INVENTION

The present invention relates to differential pair amplifiers, and in particular to a folded floating-gate differential pair.

BACKGROUND OF THE INVENTION

Conventional MOS differential pairs are used as inputs to operational amplifiers, operational transconductance amplifiers (OTAs), mixers, and many other circuits. The differential pair convert a voltage difference into a current difference in a more or less linear fashion, independent of common-mode input voltage. FIG. 1 shows a prior art differential pair comprising a simple nMOS differential pair biased using a constant current source provided by a single saturated nMOS transistor. A nearly constant transconductance is maintained by keeping the sum of the two output currents, $I_1+I_2$, fixed at a constant value, $I_b$. The voltage on a common source node, V, moves up and down with the input voltages $V_1$ and $V_2$.

In order to maintain a constant transconductance from such a simple differential pair, the common-mode input voltage should stay sufficiently far above ground so that the gate-to-source voltage of the input transistors is large enough for them to pass a significant fraction of $I_b$ and so that the transistor that sinks the bias current remains in saturation. For bias currents at or near threshold, the input common-mode voltage must remain greater than approximately $V_{T0}+V_{sat}$. This restriction on the common-mode input voltage makes the simple differential pair unattractive for low-voltage (e.g., $V_{DD} \leq 2$ V) applications.

One method that has been proposed for overcoming this limitation of the simple differential pair in low-voltage applications is to construct the differential pair from floating-gate MOS (FGMOS) transistors, as shown in prior art FIG. 2. Charge stored on the gates of the FGMOS transistors are used as a level shift so that the common-mode control-gate input voltage can be at ground, while the common-mode floating-gate voltage is high enough to permit proper operation of the differential pair. However, this scheme actually reduces the output-voltage swing, because the common-source node will be higher than it would be in the conventional differential pair for any given common-mode input voltage.

SUMMARY OF THE INVENTION

A folded floating-gate MOS differential pair amplifier comprises a matched pair of transistors whose output currents are summed and compared with a constant bias current. The voltage at a comparison node is used to regulate the total output current via shunt feedback to the gates of each transistor in the pair. The swing of this voltage is folded up into the same range over which the input and output voltages swing. Output currents for the circuit are formed with a second set of matched transistors as mirror copies of those that are regulated. In a further embodiment, feedback that regulates the sum of the currents is provided to an extra control gate connected to the floating gates.

The control gate comprises a capacitor in one embodiment that is coupled to gates of the differential pair transistors and to those of the output transistors.

DETAILED DESCRIPTION OF THE INVENTION

In the following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents. The following description is, therefore, not to be taken in a limited sense, and the scope of the present invention is defined by the appended claims.

Figure 1:
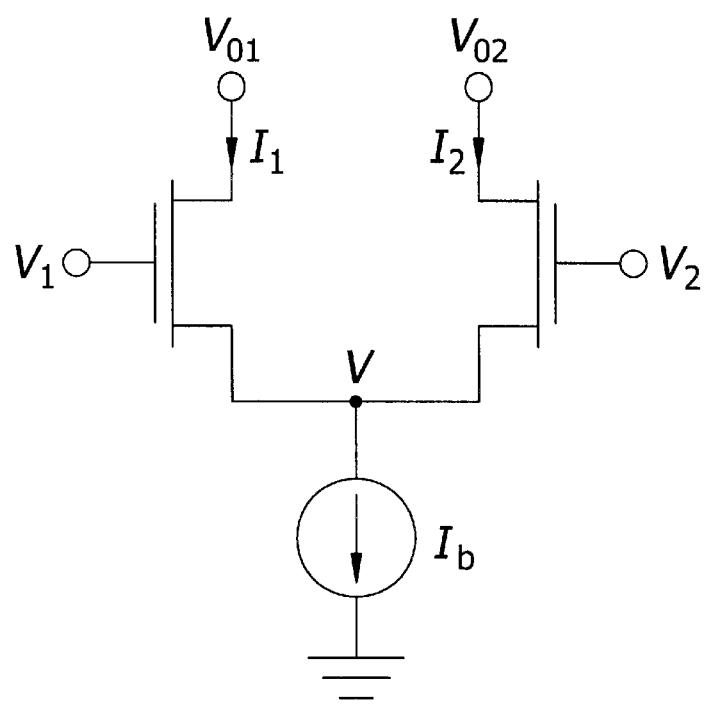
FIG. 1 is a prior art circuit diagram of a conventional MOS differential pair amplifier.
Figure 2:
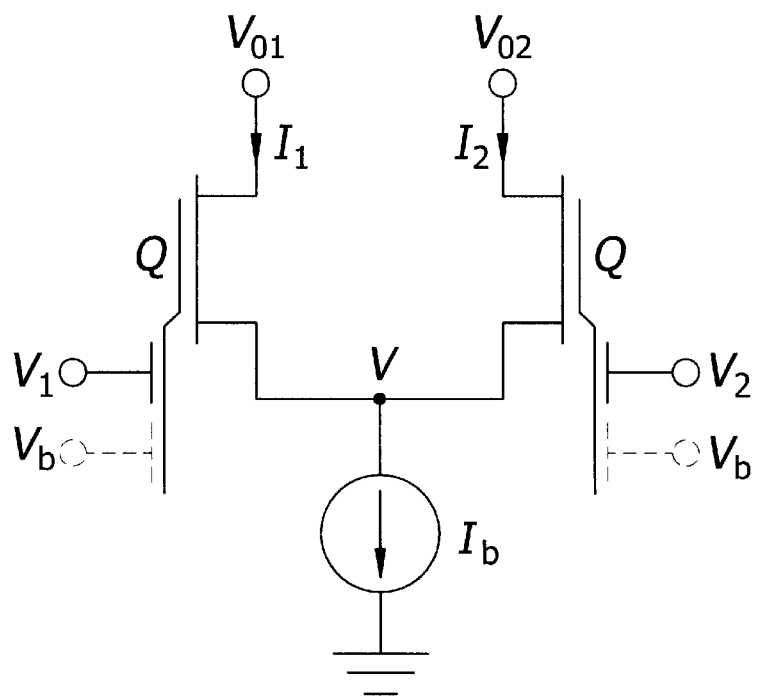
FIG. 2 is a prior art circuit diagram of a floating-gate differential pair amplifier.
Figure 3:
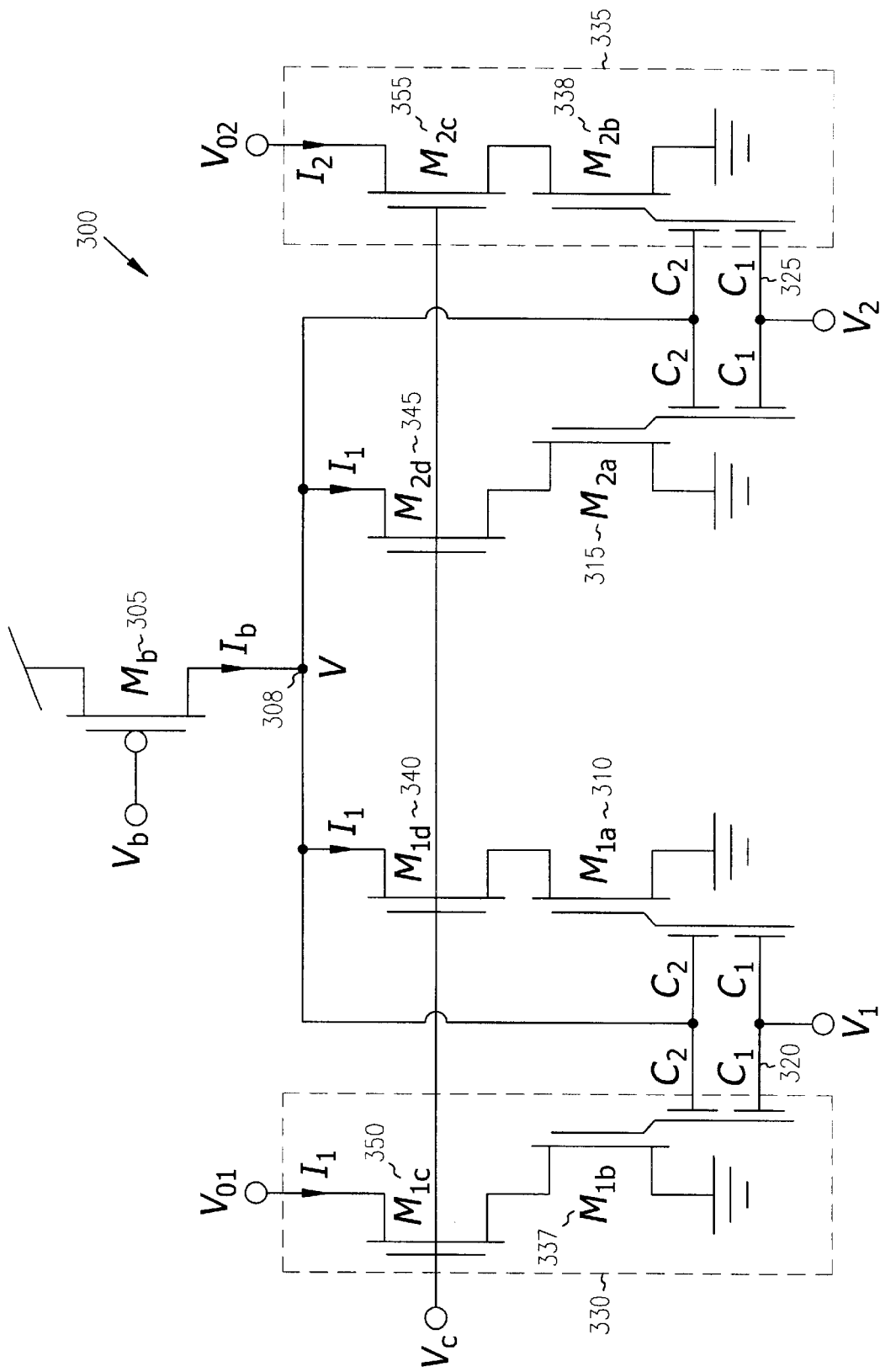
FIG. 3 is a circuit diagram of a folded floating-gate differential pair amplifier in accordance with the present invention.

A folded floating-gate MOS differential pair amplifier is shown at 300 in FIG. 3. A constant current source 305 comprises a gate biased by a voltage $V_b$, and has a constant current $I_b$ flowing from drain to source as shown. The current $I_b$ is received at node V 308, which is a feedback voltage node. The current $I_b$ is divided between a first floating-gate transistor 310 and a second floating-gate transistor 315. The floating-gate transistors 310 and 315 have gates coupled to control gates 320 and 325, which comprise capacitive voltage dividers between $C_1$ and $C_2$. The control gates 320 and 325 are coupled to feedback at node 308, and are also coupled to input voltages $V_1$ and $V_2$ to sum the input voltages and the feedback voltage by capacitive voltage division, which is also used to control current flowing through each of the floating-gate transistors 310 and 315.

A pair of output transistors 330 and 335 are provided in parallel with the floating-gate transistors to mirror the current flowing through each of the floating-gate transistors 310 and 315. The output transistors 330 and 335 each comprise respective floating-gate transistors 337 and 338, having floating gates coupled to the control gates 320 and 325 in the same manner as the floating-gate transistors 310 and 315. Central cascode transistors 340 and 345 are coupled in series with floating-gate transistors 310 and 315 to node 308.

Output cascode transistors 350 and 355 are coupled in series with the mirror floating-gate transistors 337 and 338. The output cascode transistors 350 and 355 mitigate the gate-to-drain capacitance of floating-gate transistors 337 and 338 respectively. The output cascode transistors 350 and 355 have drains coupled to output voltages $V_{01}$ and $V_{02}$ respectively. Each of the cascode transistors 340, 345, 350 and 355 have gates coupled to a common bias voltage $V_c$.

In operation, the floating-gate amplifier 300 substantially provides a rail-to-rail input voltage range, and a wide output voltage swing. The circuit functions the same was as a conventional differential pair, except that the output currents are mirror copies of the currents whose sum is regulated by V at node 308. In addition, feedback, V is applied to control gates 320 and 325. In this configuration, the swing of the voltage that regulates the sum of the output currents is folded up into the same range over which the input and output voltages swing, facilitating low-voltage operation. Moreover, the output transistors have their sources grounded, allowing an output-voltage swing extending almost to ground, which is the negative supply rail.

Figure 4:
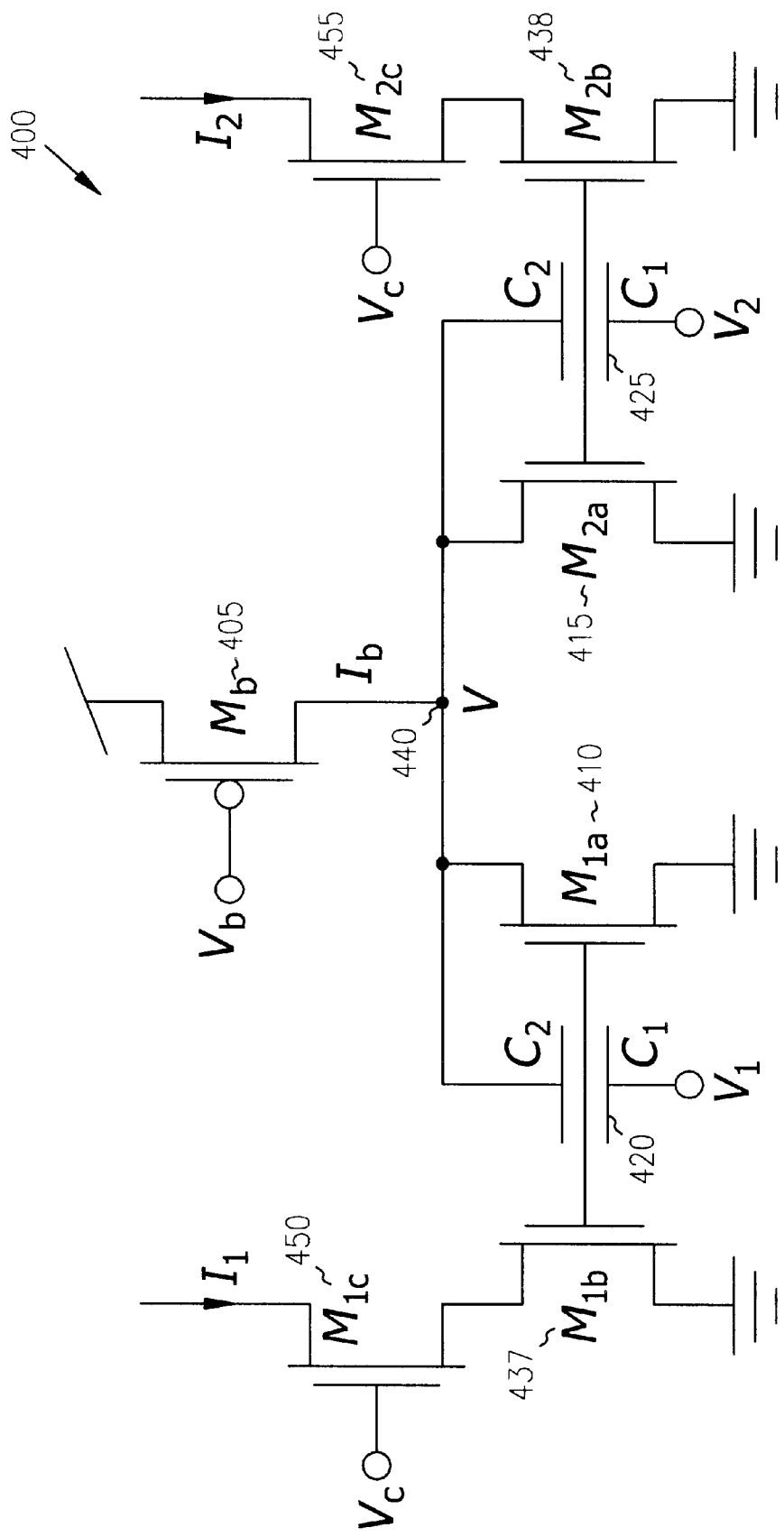
FIG. 4 is a circuit diagram of an alternative folded floating-gate differential pair amplifier in accordance with the present invention.

A further embodiment of a folded floating-gate MOS differential pair amplifier is shown at 400 in FIG. 4. Amplifier 400 is different from amplifier 300 in that all floating-gate transistors share a single floating gate on each side of the circuit, negating the need for the pair of central cascode transistors and an extra set of control gates on each side. In amplifier 400, a constant current source 405 comprises a gate biased by a voltage $V_b$, and has a constant current $I_b$ flowing from drain to source as shown. The current $I_b$ is received at node V 408, which is a feedback voltage node. The current $I_b$ is divided between a first floating-gate transistor 410 and a second floating-gate transistor 415. The floating-gate transistors 410 and 415 have gates coupled to control gates 420 and 425, which comprise capacitive voltage dividers between $C_1$ and $C_2$. The control gates 420 and 425 are coupled to feedback at node 408, and are also coupled to input voltages $V_1$ and $V_2$ to sum the input voltages and the feedback voltage by capacitive voltage division, which is also used to control current flowing through each of the floating-gate transistors 410 and 415.

A pair of current mirrors 430 and 435 are provided in parallel with the floating-gate transistors to mirror current flowing through each of the floating-gate transistors 410 and 415. The current mirrors 430 and 435 each comprise respective floating-gate transistors 437 and 438, having floating gates coupled to the control gates 420 and 425 in the same manner as the floating-gate transistors 410 and 415. Output cascode transistors 450 and 455 are coupled in series with the output floating-gate transistors 437 and 438. Output cascode transistors 450 and 455 have drains coupled to output voltages $V_{01}$ and $V_{02}$ respectively. Each of the cascode transistors 450 and 455 has gates coupled to a common bias voltage $V_c$.

In operation, the floating-gate amplifier 400 substantially provides a rail-to-rail input voltage range, and a wide output voltage swing. The circuit functions the same was as a conventional differential pair, except that the output currents are mirror copies of the currents whose sum is regulated by V at node 408. In addition, feedback, V is applied to control gates 420 and 425. In this configuration, the swing of the voltage that regulates the sum of the output currents is folded up into the same range over which the input and output voltages swing, facilitating low-voltage operation. Moreover, the output transistors have their sources grounded, allowing an output-voltage swing extending almost to ground, which is the negative supply rail.

In one embodiment, all like devices are well matched, and for selected frequencies, the transistors remain in saturation mode. At low frequencies, the incremental differential-mode transconductance gain is relatively constant until the input signal reaches a frequency close to the nMOS bias current transistor's transition frequency for the bias current level. Thus, the differential pair circuit of FIG. 4 is capable of wideband operation relative to its bias current.

By changing capacitance $C_1$ of control gates 320 and 325, the transconductance of the differential pair is increased or decreased proportionally for a given bias current. In one operational amplifier embodiment, the input stage is designed to operate at a single bias current, and a high transconductance is desired, resulting in a higher voltage gain. Increasing $C_1$ provides such a result. When designing operational transconductance amplifiers (OTAs), such as for use in OTA-C filters, a range of bias current levels is desired, along with lower transconductance for any given bias current. Decreasing $C_1$ provides a proportionally larger linear range. By changing $C_2$, the low-frequency common-mode rejection ratio (CMRR) is increased or decreased proportionally. For applications requiring a high rejection of common-mode input signals, $C_2$ is increased. $C_2$ controls how much V changes in response to changes in either $V_{cm}$ or $I_b$.

In one embodiment, the circuit of FIG. 4 is fabricated in a 1.2-um double-poly n-well CMOS process. Each nMOS transistor is formed as eight strips, each 54 um wide and 3.6 um long arranged in a stacked geometry, giving the transistors an effective width of 432 um and a length of 3.6 um. The bias transistor is formed as a pMOS transistor with sixteen strips of the same drawn dimensions as the nMOS transistors. Control gate capacitances are formed as poly 1-poly 2 capacitors with $C1\approx1.2$ pF and $C2\approx5.3$ pF. $V_c$ is set at 0.85V, and $V_{DD}$ at 1.6V. This method of fabrication is shown as an example of one method of fabricating the circuit. Many other methods and dimensions for the circuit elements may be used to obtain different performance points for the circuit.

Figure 5:
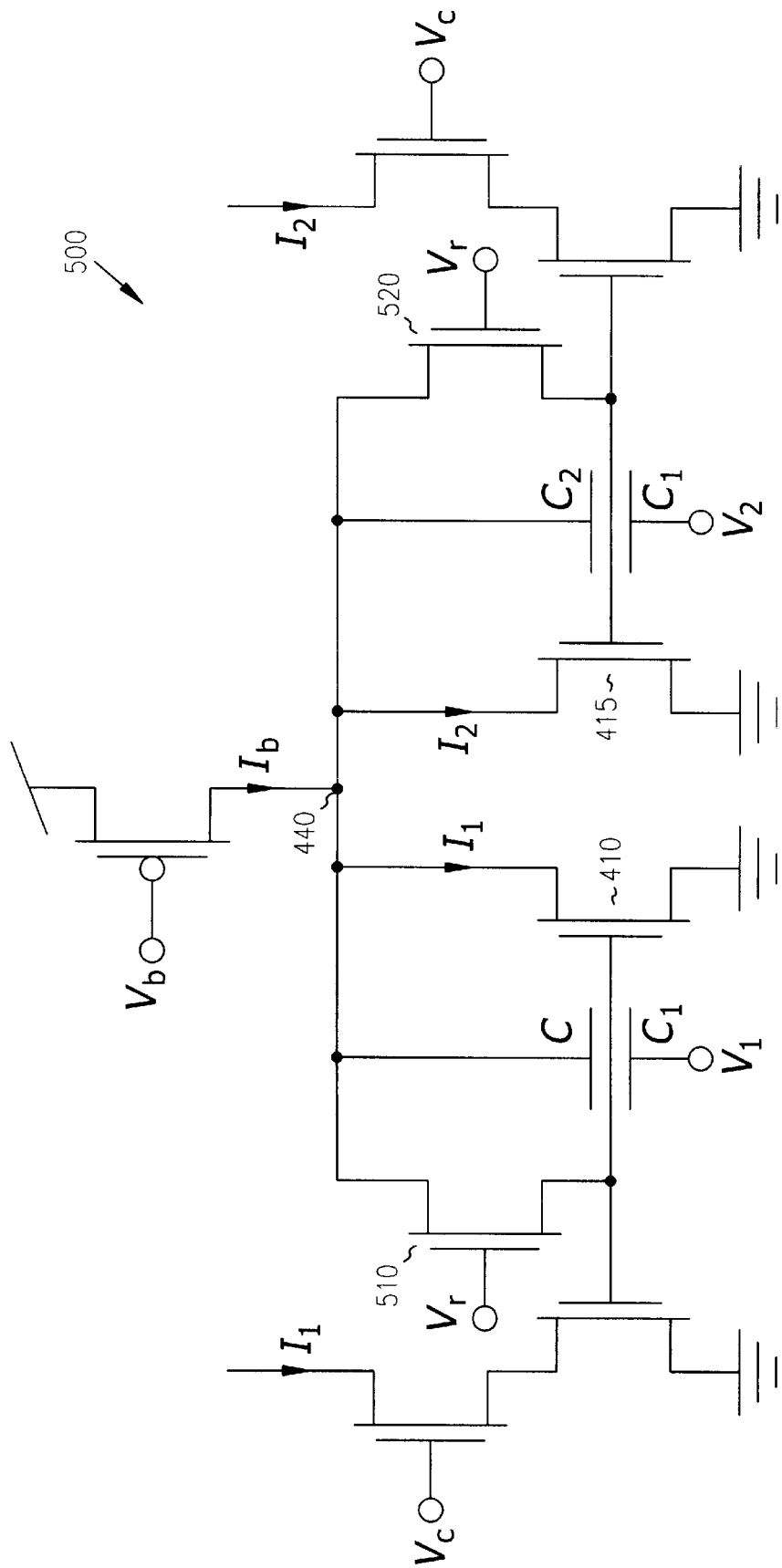
FIG. 5 is a circuit diagram of a further alternative folded floating-gate differential pair amplifier with resistive feedback.

FIG. 5 shows a variation of the circuit of FIG. 4 at 500. The numbering of like parts is consistent between the two Figures. Resistive feedback circuits are indicated at 510 and 520 coupled between node 440 and the gates of floating-gate transistors 410 and 415 in parallel with $C_2$. The feedback is controlled by a voltage $V_r$. The resistive path introduces a first order low frequency roll off whose corner frequency is set by $C_T$ and $V_r$. At DC, the circuit is a pair of current mirrors sharing $I_b$ equally. Above the corner, it acts as the floating-gate circuit described herein.

In a further variation of the circuit of FIG. 5, $V_r$ comprises a clock signal. When the clock signal is high, the circuit rebalances itself. When the clock signal is low, the circuit acts just like the floating-gate circuit. Injected charge is rejected as a common-mode signal if it matches on both sides of the circuit.

I claim:

1. An amplifier comprising:
   a constant bias current source;
   a first pair of floating-gate transistors coupled in parallel to the constant current source;
   a pair of output transistors coupled in parallel with the differential-pair floating-gate transistors; and
   a feedback path coupled to the constant current source and gates of the first pair of floating-gate transistors.

2. The amplifier of claim 1 wherein the feedback path provides a regulating feedback voltage that is folded up into the same range over which input and output voltages swing.

3. The amplifier of claim 1 wherein each output transistor pair comprises a floating-gate transistor and a cascode transistor.

4. The amplifier of claim 3 wherein the output transistors have respective sources that are grounded, allowing a wide output-voltage swing.

5. The amplifier of claim 1 wherein the first pair of floating-gate transistors each have a first floating gate coupled to the feedback path, and a second floating gate coupled to respective input voltages.

6. The amplifier of claim 1 wherein the output transistor pairs each comprise a floating-gate transistor having a gate coupled to a corresponding gate of the first pair of floating-gate transistors.

7. The amplifier of claim 1 wherein each transistor of the first pair of floating-gate transistors has a gate coupled to a capacitive voltage divider.

8. The amplifier of claim 7 wherein the capacitive divider has a first input coupled to an input voltage, and a second input coupled to the feedback path.

9. The amplifier of claim 8 wherein the output transistors each comprise a floating-gate transistor having a gate coupled to respective capacitive voltage dividers.

10. An amplifier comprising:

a constant bias current source;

a first pair of floating-gate transistors coupled in parallel to the constant current source;

a feedback path coupled to the constant current source and gates of the first pair of floating-gate transistors; and wherein each feedback path comprises a control gate coupled to an input voltage.

11. The amplifier of claim 10, wherein the each control gate comprises a pair of series coupled capacitors.

12. The amplifier of claim 11 wherein the gates of the floating-gate transistors are coupled between the series coupled capacitors.

13. The amplifier of claim 11 wherein the feedback path further comprises a resistive component.

14. The amplifier of claim 13 wherein the resistive component is controlled by a constant voltage, or a clock signal.

15. An amplifier comprising:

means for providing a constant bias current;

a first pair of floating-gate transistors coupled such that the sum of current flowing through them is equal to the constant bias current;

means for mirroring current flowing through the floating-gate transistors; and means for providing feedback to the gates of the first pair of floating-gate transistors.

16. The amplifier of claim 15 wherein a voltage drop across the means for providing a constant bias current is folded up into the same range over which output voltages swing.

17. The amplifier of claim 15 wherein each means for mirroring current comprises means for providing an output.

18. The amplifier of claim 17 wherein the means for providing an output comprise output transistors have respective sources that are grounded, allowing a wide output-voltage swing.

19. The amplifier of claim 15 wherein the first pair of floating-gate transistors each have a first floating gate coupled to the means for providing feedback, and a second floating gate coupled to respective input voltages.

20. The amplifier of claim 15 wherein the means for mirroring current comprise a floating-gate transistor having a gate coupled to a corresponding gate of the first pair of floating-gate transistors.

21. The amplifier of claim 15 wherein each transistor of the first pair of floating-gate transistors has a gate coupled to a means for controlling the gate.

22. The amplifier of claim 21 wherein the means for controlling the gate comprise capacitive voltage dividers.

23. The amplifier of claim 22 wherein the capacitive dividers have a first input coupled to an input voltage, and a second input coupled to the means for providing feedback.

24. The amplifier of claim 23 wherein the means for mirroring current each comprise a floating-gate transistor having a gate coupled to respective capacitive voltage dividers.

* * * * *